United States Patent
Chiang

(10) Patent No.: US 7,106,238 B2
(45) Date of Patent: Sep. 12, 2006

(54) INPUT DATA SLICER

(75) Inventor: Ming-Cheng Chiang, Hsin-Chu (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 11/163,281

(22) Filed: Oct. 13, 2005

(65) Prior Publication Data

US 2006/0082487 A1    Apr. 20, 2006

(30) Foreign Application Priority Data

Oct. 15, 2004    (TW)    ............................. 93131391 A

(51) Int. Cl.
*H03M 1/12*    (2006.01)
(52) U.S. Cl. ...................... 341/155; 341/156
(58) Field of Classification Search ................ 341/155, 341/156; 375/317
See application file for complete search history.

(56) References Cited

U.S. PATENT DOCUMENTS

| | | | |
|---|---|---|---|
| 5,933,455 A * | 8/1999 | Hendrickson et al. | 375/261 |
| 6,525,684 B1 * | 2/2003 | Tsujikawa | 341/155 |
| 2003/0194023 A1* | 10/2003 | Nakano | 375/317 |
| 2005/0074076 A1* | 4/2005 | Chen et al. | 375/317 |

* cited by examiner

*Primary Examiner*—Rexford Barnie
*Assistant Examiner*—Joseph Lauture
(74) *Attorney, Agent, or Firm*—Winston Hsu

(57) ABSTRACT

A method for slicing a differential input signal formed of first and second analog signals, including: receiving the first and second analog signals; adjusting direct current (DC) levels of the first and second analog signals according to a first voltage; comparing voltage difference between the first and second analog signals to generate an output signal; generating an output voltage according to the output signal; and respectively providing first and second currents applied to the first and second analog signals according to the output voltage.

22 Claims, 1 Drawing Sheet

INPUT DATA SLICER

BACKGROUND OF THE INVENTION

1. Field of the Invention

The present invention relates to a data slicer, and more particularly, to a differential input data slicer.

2. Description of the Prior Art

An input data slicer is an important component for many data recovery devices and signal equalizers. The conventional data slicer is a single-ended circuit. The single-ended data slicer is used for comparing an analog input signal with a reference level (or referred to as a slicing level) to accordingly determine that the binary value of the input signal is either "0" or "1."

However, as is well known in the art, the conventional single-ended data slicer has poor noise immunity. If noise interferes with the data slicer, the correctness of the output signal is easily affected. As a result, the performances of the following stages and entire system are reduced.

In U.S. Pat. No. 6,525,684, a differential input data slicer is disclosed. The disadvantage of the conventional data slicer is that the conventional data slicer can only support the DC couple architecture.

SUMMARY OF THE INVENTION

It is therefore an objective of the claimed invention to provide a data slicer to solve the above-mentioned problems.

According to an exemplary embodiment of the present invention, a data slicer for slicing a differential input signal formed of first and second analog signals is disclosed comprising: a differential comparator having a first input and a second input for respectively receiving the first and second analog signals, for receiving a first voltage and comparing voltage difference between the first and second analog signals to generate an output signal, wherein direct current (DC) levels of the first and second analog signals are determined according to the first voltage; an integrator circuit coupled to the differential comparator for generating an output voltage according to the output signal; and a transconductance amplifier coupled to the differential comparator and the integrator for providing first and second currents to the first and second inputs of the differential comparator respectively, according to the output voltage.

According to the exemplary embodiment of the present invention, a method for slicing a differential input signal formed of first and second analog signals is also disclosed comprising: receiving the first and second analog signals; adjusting direct current (DC) levels of the first and second analog signals according to a first voltage; comparing voltage difference between the first and second analog signals to generate an output signal; generating an output voltage according to the output signal; and respectively providing first and second currents applied to the first and second analog signals according to the output voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
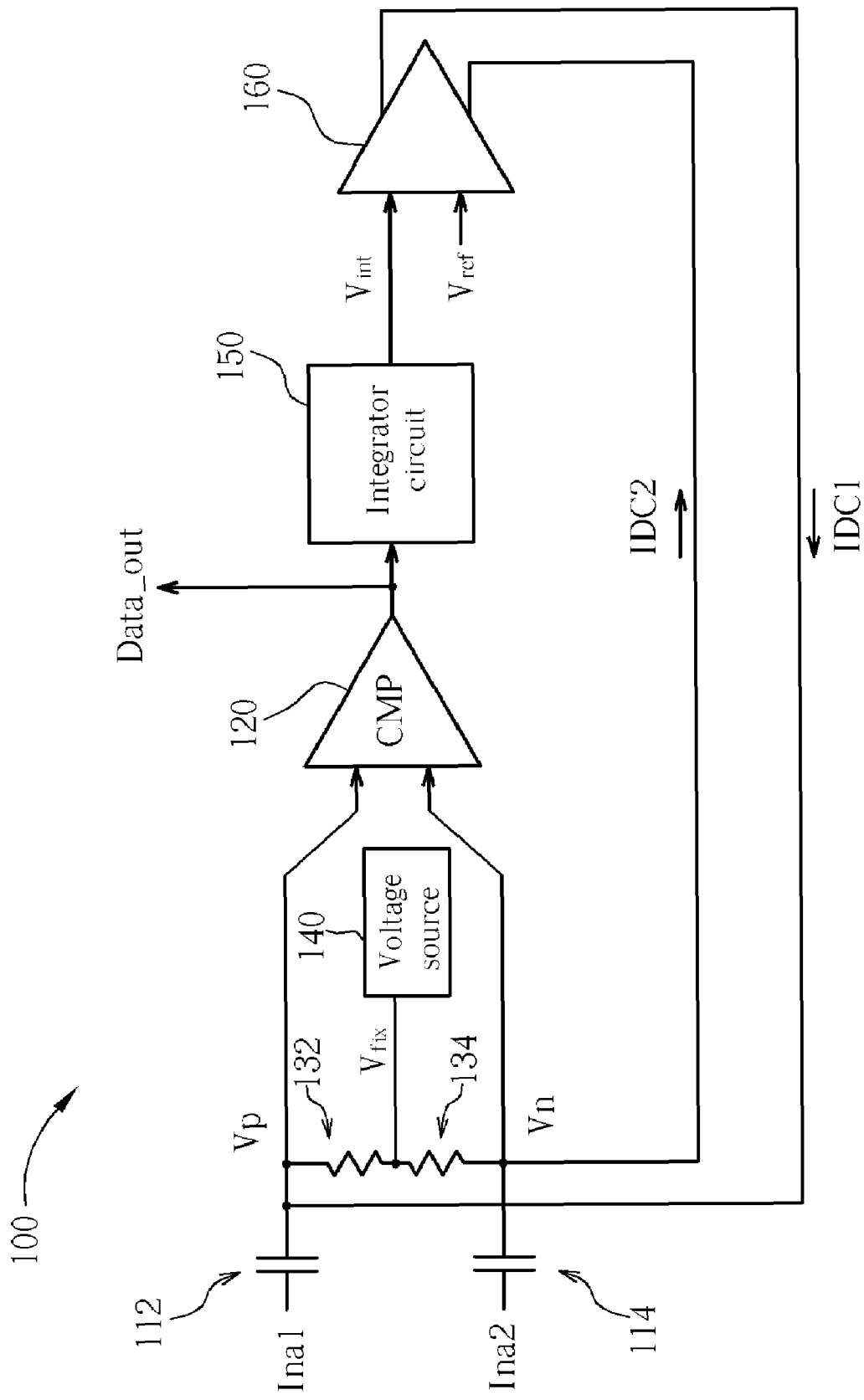
FIG. 1 is a block diagram of an input data slicer according to an exemplary embodiment of the present invention.

The input data slicer of the present invention supports both the AC couple architecture and DC couple architecture.

Please refer to FIG. 1, which illustrates a block diagram of an input data slicer 100 according to an exemplary embodiment of the present invention. The data slicer 100 is used for slicing a differential input signal formed of a first analog signal Ina1 and a second analog signal Ina2 to produce an output signal Data_out. In this embodiment, the data slicer 100 adopts AC couple architecture, so that the first analog signal Ina1 and the second analog signal Ina2 are differential AC signals. As shown in FIG. 1, the data slicer 100 comprises a first capacitor 112, a second capacitor 114, a differential comparator 120, a first resistor 132, a second resistor 134, a voltage source 140, an integrator circuit 150, and a differential transconductance amplifier 160. The data slicer 100 has better noise immunity because it adopts a differential architecture.

In the data slicer 100 of this embodiment, the first capacitor 112 is used for receiving the first analog signal Ina1 and blocking the DC components of the first analog signal Ina1. Similarly, the second capacitor 114 is used for receiving the second analog signal Ina2 and blocking the DC components of the second analog signal Ina2. The differential comparator 120 has first and second input terminals, the first input terminal coupled to the output of the first capacitor 112 while the second input terminal is coupled to the output of the second capacitor 114. In addition, the first and second input terminals of the differential comparator 120 are coupled to the voltage source 140 via the first resistor 132 and the second resistor 134, respectively. The voltage source 140 is used for supplying a predetermined voltage $V_{fix}$. Preferably, the first capacitor 112 is substantially the same as the second capacitor 114.

The differential comparator 120 compares the voltage difference between the first and second input terminals to decide the logic level of the output signal Data_out. For example, when voltage Vp applied to the first input terminal is higher than voltage Vn applied to the second input terminal, the differential comparator 120 sets the output signal Data_out to logic "1". For the opposite condition, when the voltage Vp applied to the first input terminal is lower than the voltage Vn applied to the second input terminal, the differential comparator 120 sets the output signal Data_out to logic "0".

As shown in FIG. 1, the voltage Vp of the first input terminal of the differential comparator 120 and the voltage Vn of the second input terminal are determined according to the predetermined voltage $V_{fix}$ supplied by the voltage source 140, the resistances of the resistors 132 and 134, and first and second currents IDC1 and IDC2 output from the differential transconductance amplifier 160. The operation of the differential transconductance amplifier 160 to generate the first current IDC1 and the second current IDC2 will be described later. Where the resistance of the first resistor 132 is herein assumed as R1 and the resistance of the second resistor 134 is assumed as R2, the voltage Vp and voltage Vn of the first and second input terminals of the differential comparator 120 could be represented as follows:

$$Vp = V_{fix} + R1 \times IDC1$$

$$Vn = V_{fix} - R2 \times IDC2 \quad (1)$$

According to the formula (1), it could be found that the DC level of the voltages Vp and Vn applied in the first and second input terminals of the differential comparator 120 are determined by the predetermined voltage $V_{fix}$ and have no relevance to the DC level of the first and second analog signals Ina1 and Ina2 transmitted from the prior stage. Accordingly, the data slicer 100 could configure the predetermined voltage $V_{fix}$ according to the feasible operating voltage range of the differential comparator 120. As a result, the selection flexibility of the differential comparator 120 could be significantly improved and not limited by the DC level of the signals transmitted from the prior stage of the data slicer 100. In a preferred embodiment, the first resistor 132 is substantially the same as the second resistor 134, i.e., R1 is identical to R2, so as to reduce the complexity of circuitry control.

In many optical storage media, such as CDs and DVDs, the digital sum value (DSV) of data is approximate to zero. Based on this characteristic, the data slicer 100 utilizes the integrator circuit 150 and the differential transconductance amplifier 160 to form a feedback control mechanism so as to automatically adjust signal offset between the two input terminals of the differential comparator 120.

As in the embodiment shown in FIG. 1, the output signal Data_out produced by the differential comparator 120 is transmitted to the integrator circuit 150. The integrator circuit 150 then accordingly generates an output voltage $V_{int}$. Generally, the integrator circuit 150 could be implemented with a charge pump in conjunction with a capacitor unit. The operation and implementations of the integrator circuit 150 are well known in the art and further details are therefore omitted here. Then, the differential transconductance amplifier 160 compares the output voltage $V_{int}$ with a reference voltage $V_{ref}$ to proportionally adjust the first current IDC1 and the second current IDC2 according to the difference between the output voltage $V_{int}$ and the reference voltage $V_{ref}$. In this embodiment, when the output voltage $V_{int}$ is equal to the reference voltage $V_{ref}$, both the first current IDC1 and the second current IDC2 output from the differential transconductance amplifier 160 are zero. When the output voltage $V_{int}$ is greater than the reference voltage $V_{ref}$, both the first current IDC1 and the second current IDC2 are negative currents. When the output voltage $V_{int}$ is lower than the reference voltage $V_{ref}$, both the first current IDC1 and the second current IDC2 are positive currents. In one embodiment, the magnitude of the first current IDC1 is identical to the magnitude of the second current IDC2. As shown in FIG. 1, the first current IDC1 and the second current IDC2 produced by the differential transconductance amplifier are respectively applied to the first and second input terminals of the differential comparator 120 so as to form a close loop.

In a preferred embodiment, the data slicer 100 further comprises a low-pass filter (not shown) coupled between the integrator circuit 150 and the differential transconductance amplifier 160, for performing low-pass filtering on the output voltage $V_{int}$ generated from the integrator circuit 150.

By employing the aforementioned feedback control mechanism, the data slicer 100 is capable of automatically adjusting the signal offset between the two input terminals of the differential comparator 120 so that the DSV of the output signal Data_out produced from the differential comparator 120 is approximate to the desirable value, zero.

As mentioned above, since the data slicer 100 of the shown embodiment adopts AC couple architecture, it requires the first capacitor 112 and the second capacitor 114 to block DC components of the first analog signal Ina1 and the second analog signal Ina2. If the data slicer 100 adopts DC couple architecture, the first capacitor 112 and the second capacitor 114 could be omitted due to the fact that the signal transmitted from the prior stage is in differential form. In other words, both the AC couple and DC couple architectures are supported by the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A data slicer for slicing a differential input signal formed of first and second analog signals, comprising:
a differential comparator having a first input and a second input for respectively receiving the first and second analog signals, for receiving a first voltage and comparing voltage difference between the first and second analog signals to generate an output signal, wherein direct current (DC) levels of voltages applied in the first and second inputs of the differential comparator are determined according to the first voltage;
an integrator circuit coupled to the differential comparator for generating an output voltage according to the output signal; and
a transconductance amplifier coupled to the differential comparator and the integrator for providing first and second currents to the first and second inputs of the differential comparator respectively, according to the output voltage.

2. The data slicer of claim 1, wherein the DC levels of the first and second analog signals be adjusted according to the first voltage.

3. The data slicer of claim 1, wherein the integrator circuit comprises a charge pump.

4. The data slicer of claim 3, further comprising a low-pass filter coupled between the charge pump and the transconductance amplifier.

5. The data slicer of claim 3, further comprising:
a first capacitor coupled to the first input for receiving the first analog signal; and
a second capacitor coupled to the second input for receiving the second analog signal.

6. The data slicer of claim 5, wherein the first capacitor is substantially the same as the second capacitor.

7. The data slicer of claim 3, further comprising:
a first resistor; and
a second resistor coupled to the first resistor to form a node for receiving the first voltage, the first and the second resistors coupled between the first and second inputs of the differential comparator.

8. The data slicer of claim 7, wherein the first resistor is substantially the same as the second resistor.

9. The data slicer of claim 1, further comprising a low-pass filter coupled between the integrator circuit and the transconductance amplifier.

10. The data slicer of claim 1, wherein the magnitude of the first current is substantially the same as the magnitude of the second current.

11. The data slicer for slicing a differential input signal formed of first and second analog signals, comprising:
a differential comparator having a first input and a second input for respectively receiving the first and second analog signals, for comparing voltage difference between the first and second analog signals to generate an output signal;
a first capacitor coupled to the first input for receiving the first analog signal and blocking the DC component of the first analog signal;

a second capacitor coupled to the second input for receiving the second analog signal and blocking the DC components of the second analog signal;

an integrator circuit coupled to the differential comparator for generating an output voltage according to the output signal; and a transconductance amplifier coupled to the differential comparator and the integrator for providing first and second currents to the first and second inputs of the differential comparator respectively, according to the output voltage.

12. The data slicer of claim 11, wherein the first capacitor is substantially the same as the second capacitor.

13. The data slicer of claim 11, further comprising:
a first resistor; and
a second resistor coupled to the first resistor to form a node for receiving the first voltage, the first and the second resistors coupled between the first and second inputs of the differential comparator.

14. The data slicer of claim 13, wherein the first resistor is substantially the same as the second resistor.

15. The data slicer of claim 11, wherein the differential comparator receives a first voltage and direct current (DC) levels of voltages applied in the first and second inputs of the differential comparator are determined according to the first voltage.

16. The data slicer for slicing a differential input signal formed of first and second analog signals, comprising:
a differential comparator having a first input and a second input for respectively receiving the first and second analog signals, for comparing voltage difference between the first and second analog signals to generate an output signal;
a first resistor;
a second resistor coupled to the first resistor to form a node for receiving a first voltage, the first and the second resistors coupled between the first and second inputs of the differential comparator;
an integrator circuit coupled to the differential comparator for generating an output voltage according to the output signal; and
a transconductance amplifier coupled to the differential comparator and the integrator for providing first and second currents to the first and second inputs of the differential comparator respectively, according to the output voltage.

17. The data slicer of claim 16, wherein the first resistor is substantially the same as the second resistor.

18. The data slicer of claim 16, wherein direct current (DC) levels of voltages applied in the first and second inputs of the differential comparator are determined according to the first voltage.

19. A method for slicing a differential input signal formed of first and second analog signals, the method comprising:
receiving the first and second analog signals by first and second inputs of a differential comparator;
receiving a first voltage, wherein direct current (DC) levels of voltages applied in the first and second inputs of the differential comparator are determined according to the first voltage;
comparing voltage difference between the first and second analog signals by the differential comparator to generate an output signal;
generating an output voltage according to the output signal; and
respectively providing first and second currents applied to the first and second analog signals according to the output voltage.

20. The method of claim 19, wherein the first and the second currents correspond to the difference between the output voltage and a second voltage.

21. The method of claim 20, wherein the magnitude of the first current is substantially the same as the magnitude of the second current.

22. The method of claim 19, further comprising:
blocking DC component of the first and the second analog signals.

* * * * *